(12) United States Patent
Gao et al.

(10) Patent No.: US 11,610,923 B2
(45) Date of Patent: Mar. 21, 2023

(54) FERROELECTRIC-OXIDE HYBRID-GATE TRANSISTOR BLOCK FOR SEMICONDUCTOR IMAGING SENSORS

(71) Applicant: Shenzhen Goodix Technology Co., Ltd., Shenzhen (CN)

(72) Inventors: Yunfei Gao, San Diego, CA (US); Tae Seok Oh, San Diego, CA (US); Jinwen Xiao, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/524,701

(22) Filed: Nov. 11, 2021

(65) Prior Publication Data

US 2022/0238580 A1     Jul. 28, 2022

Related U.S. Application Data

(60) Provisional application No. 63/141,262, filed on Jan. 25, 2021.

(51) Int. Cl.
| | |
|---|---|
| *H01L 27/146* | (2006.01) |
| *H04N 5/351* | (2011.01) |
| *H04N 5/3745* | (2011.01) |
| *H04N 5/378* | (2011.01) |

(52) U.S. Cl.
CPC ....... *H01L 27/14614* (2013.01); *H04N 5/351* (2013.01); *H04N 5/378* (2013.01); *H04N 5/3745* (2013.01); *H01L 27/1464* (2013.01); *H01L 27/14603* (2013.01); *H01L 27/14641* (2013.01)

(58) Field of Classification Search
CPC .......... H01L 27/1461; H01L 27/14603; H01L 27/1464; H01L 27/14641; H04N 5/351; H04N 5/3745; H04N 5/378; H04N 5/3559
See application file for complete search history.

(56) References Cited

U.S. PATENT DOCUMENTS

| | | | |
|---|---|---|---|
| 10,536,652 B2 * | 1/2020 | Oh | H01L 27/14609 |
| 11,380,708 B2 * | 7/2022 | Chang | G11C 11/2257 |

* cited by examiner

*Primary Examiner* — Ahmed A Berhan
(74) *Attorney, Agent, or Firm* — Kilpatrick Townsend & Stockton LLP

(57) ABSTRACT

A hybrid ferroelectric-metal-oxide-semiconductor field effect transistor (Fe-MOSFET) device is described, such as for incorporation into in-pixel circuitry of an imaging pixel array to provide both reset and dual conversion gain features. The Fe-MOSFET includes source and drain regions implanted in a semiconductor substrate and separated by a channel region. The source region can be the floating diffusion region of a photosensor. A gate structure is deposited on the substrate directly above at least the channel region and an isolating layer is formed on the surface of the substrate to electrically isolate the gate structure from at least the channel region. The isolating layer is split into a Fe segment of ferroelectric material that can be written to different polarization states for conversion gain control, and a dielectric segment that can be used for current channel formation in the channel region.

20 Claims, 11 Drawing Sheets

FERROELECTRIC-OXIDE HYBRID-GATE TRANSISTOR BLOCK FOR SEMICONDUCTOR IMAGING SENSORS

CROSS-REFERENCES

This application is a non-provisional of, and claims the benefit of priority from, U.S. Provisional Patent Application No. 63/141,262, filed Jan. 25, 2021, titled "FERROELECTRIC-OXIDE HYBRID GATE TRANSISTOR AND ITS APPLICATIONS IN SEMICONDUCTOR IMAGING SENSORS," which is hereby incorporated herein by reference in its entirety.

TECHNICAL FIELD

The present document relates to complementary metal-oxide semiconductor (CMOS) image sensors. More particularly, embodiments relate to ferroelectric-oxide hybrid-gate reset transistors for integration with in-pixel circuitry of CMOS image sensor (CIS) pixels.

BACKGROUND

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each imaging pixel can include a photosensing element that responds to light to generate photocharge, and in-pixel circuitry for processing the generated photocharge to produce an electrical pixel output signal and for controlling operations of each imaging pixel. The in-pixel circuitry includes transistors for performing sensing and control functions.

Performance of an imaging sensor pixel relates to how well the pixel can convert photons into electrical charges. Such performance can depend on a number of physical and electrical characteristics of the pixel, such as well capacity, dynamic range, and conversion gain. Well capacity relates to the amount of charge that can be held by the imaging pixel during integration (i.e., during exposure to light, prior to readout). It can be desirable to have a large dynamic range, which indicates that the pixel performs well over a large range of lighting conditions, such as from very low-light conditions up to high-light conditions (i.e., where full well capacity, or FWC, may be reached). It can also be desirable to have higher conversion gain, which indicates a larger increase in output signal voltage with any increase in accumulated charge. Typically, the output signal level corresponds to the ratio between the accumulated charge in the well and the well capacitance. For example, a smaller well can tend to have less capacity to accumulate charge and correspondingly smaller well capacitance, which can tend to result in a larger change in output signal level for any change in charge accumulation in the well.

BRIEF SUMMARY

Embodiments disclosed herein include, among others, a transistor design with a unique hybrid structure to replace a gate oxide between the gate electrode and the transistor channel: the unique hybrid structure includes both a gate dielectric segment formed of a dielectric material (e.g., an oxide or a high-k dielectric) and a ferroelectric segment including a ferroelectric material are placed between the gate electrode and the transistor channel so that the two segments under the gate electrode are controlled by a common gate voltage applied to the gate electrode. The ferroelectric material used in this transistor has two electric polarization states that can be switched by applying a sufficiently large positive or negative gate voltage to provide unique functions for the transistor in various applications. Such a hybrid transistor can be used to perform both gain control and reset operations in a sensing pixel in semiconductor imaging sensor arrays to reduce the number of circuitry hardware in each pixel and to improve the integrated density while allowing the in-pixel space to be sufficiently allocated to the photosensing element for collecting light.

For example, such a transistor with the above unique hybrid structure can be included in in-pixel circuitry of an image sensor pixel to perform both (1) the dual conversion gain (DCG) function for improving the low light detection sensitivity and the dynamic range of each sensing pixel and (2) resetting the image sensor pixel before and after readout without using two separate transistors in some other imaging sensor designs that are respectively designated for the DCG function and reset function. This implementation advantageously reduces the number of transistors in the in-pixel circuitry of an imaging sensor array and can beneficially reduce the size of each pixel, a desirable feature for various imaging sensor applications.

According to a first set of embodiments, a complementary metal-oxide semiconductor (CMOS) imaging sensor (CIS) is provided. The CIS includes one or more imaging pixels. Each imaging pixel includes: a semiconductor substrate doped according to a first doping type; a photo-sensor block comprising at least one photodiode configured to accumulate photocarriers responsive to exposure to illumination and to transfer the accumulated photocarriers to a floating diffusion region for readout, the floating diffusion region formed by implanting a first well of a second doping type into the semiconductor substrate, the second doping type being different from the first doping type; and a hybrid ferroelectric-metal-oxide-semiconductor field effect transistor (Fe-MOSFET) device. The hybrid Fe-MOSFET includes: a drain region formed by implanting a second well of the second-doping-type material into the semiconductor substrate, the drain region separated from the floating diffusion region by a channel region; a gate structure deposited on the semiconductor substrate directly above at least the channel region and having a gate electrode patterned thereon; and a gate isolating layer formed on the surface of the semiconductor substrate to electrically isolate the gate structure from at least the channel region, the gate isolating layer comprising: a Fe segment made of a ferroelectric material and sandwiched between the gate structure and a first channel sub-region of the channel region adjacent to the floating diffusion region, the Fe segment configured to be toggled between a high conversion gain mode and a low conversion gain mode; and a dielectric segment sandwiched between the gate structure and a second channel sub-region of the channel region that is adjacent to the drain region and is non-overlapping with the first sub-region.

According to another set of embodiments, a hybrid ferroelectric-metal-oxide-semiconductor field effect transistor (Fe-MOSFET) device is provided. The hybrid Fe-MOSFET includes: a semiconductor substrate doped according to a first doping type; a source region and a drain region, each formed by implanting a respective well of second-doping-type material into the semiconductor substrate, the source region and the drain region separated by a channel region; a gate structure deposited on the semiconductor substrate directly above at least the channel region and having a gate electrode patterned thereon; and a gate isolating layer formed on the surface of the semiconductor substrate to electrically isolate the gate structure from at least the channel region, the gate isolating layer including: a Fe segment made of a ferroelectric material and sandwiched between the gate structure and a first channel sub-region of the channel region adjacent to the source region; and a dielectric segment sandwiched between the gate structure and a second channel sub-region of the channel region that is adjacent to the drain region and is non-overlapping with the first sub-region.

According to another set of embodiments, a method is provided for generating a pixel output signal with dual conversion gain in a complementary metal-oxide semiconductor (CMOS) imaging sensor (CIS). The method includes: communicating a write pulse at a write magnitude and at one of two write polarizations to a gate electrode of a hybrid ferroelectric-metal-oxide-semiconductor field effect transistor (Fe-MOSFET), the hybrid Fe-MOSFET including: a drain region and a source region, each formed by implanting, into a semiconductor substrate of a first doping type, a well of a second doping type, the drain region separated from the source region by a channel region; a gate structure deposited on the semiconductor substrate directly above at least the channel region and having the gate electrode patterned thereon; and a gate isolating layer formed on the surface of the semiconductor substrate to electrically isolate the gate structure from at least the channel region, the gate isolating layer comprising a Fe segment made and a dielectric segment, the Fe segment made of a ferroelectric material and sandwiched between the gate structure and a first channel sub-region of the channel region adjacent to the floating diffusion region, and the dielectric segment sandwiched between the gate structure and a second channel sub-region of the channel region that is adjacent to the drain region and is non-overlapping with the first sub-region, wherein the write pulse writes the Fe segment to a selected one of two conversion gain modes by aligning dipoles of the ferroelectric material to a corresponding one of two ferroelectric polarization states in accordance with whichever of the write polarizations is communicated by the write pulse; and communicating a reset pulse at a reset magnitude to the gate electrode of the hybrid Fe-MOSFET subsequent to the communicating the write pulse, the reset magnitude being less than the write magnitude, such that the dielectric segment responds to the reset pulse to form a current channel between the source region and the drain region across the channel region without affecting alignments of the dipoles in the Fe segment.

The drawings, the description and the claims below provide a more detailed description of the above and other aspects of transistors with a hybrid structure, their implementations and features of the disclosed technology.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each imaging pixel can include a photosensing element that responds to light to generate photocharge, and in-pixel circuitry for processing the generated photocharge to produce an electrical pixel output signal and for controlling operations of each imaging pixel. The in-pixel circuitry of a CIS imaging pixel typically includes a number of metal-oxide semiconductor field-effect transistors (MOSFETs) for performing sensing and control functions.

Figure 1:
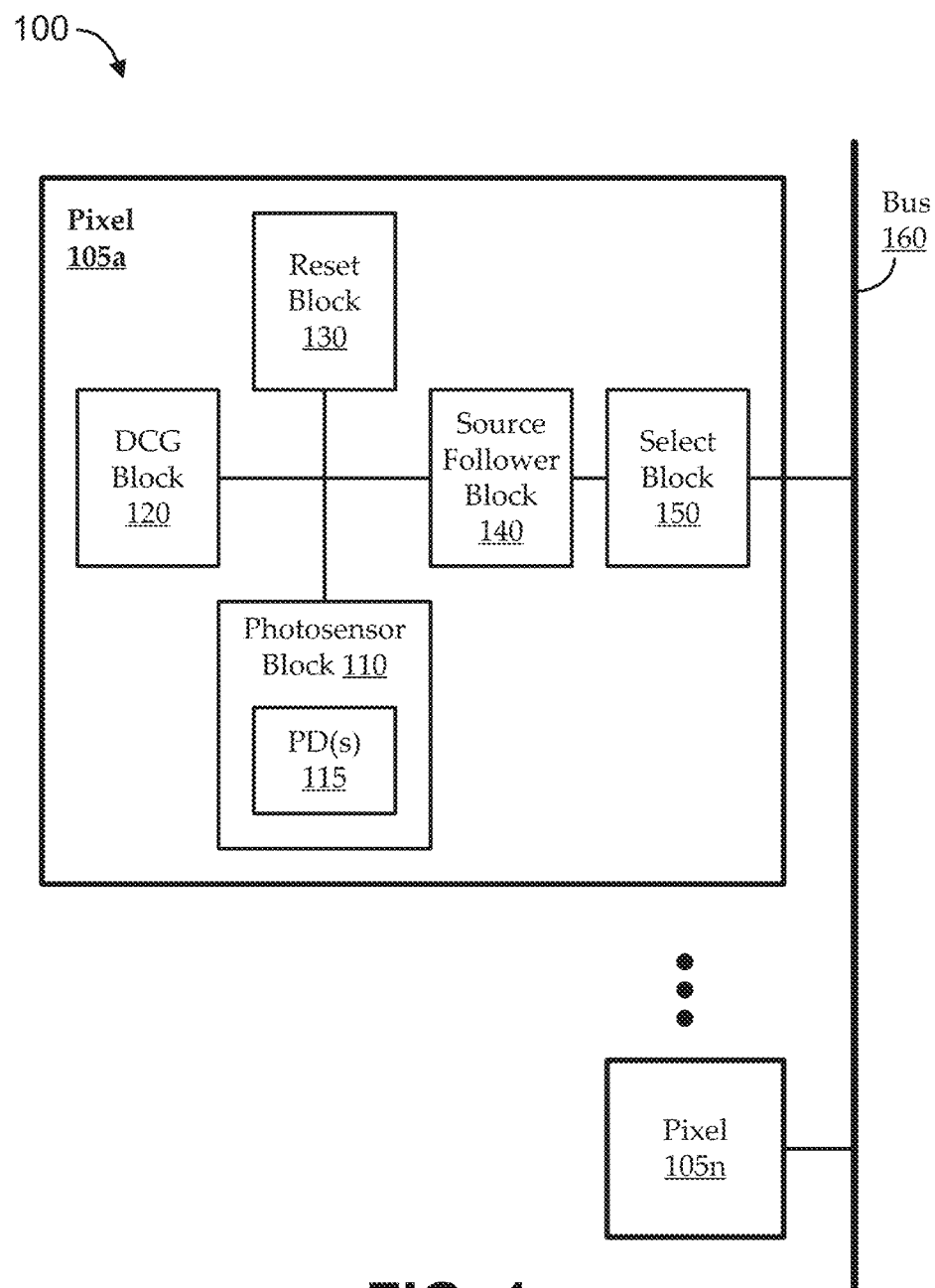
FIG. 1 shows a simplified block diagram of a portion of an illustrative digital imaging system, as context for various embodiments described herein.

FIG. 1 shows a simplified block diagram of a portion of an illustrative digital imaging system 100, as context for various embodiments described herein. The digital imaging system 100 can be built around a complementary metal-oxide semiconductor (CMOS) image sensor (CIS) technology. Such a CIS system can typically include one or more arrays of pixels 105, such as a large number of pixels 105 arranged in rows and columns. Each pixel 105 can include a photo-sensor block 110, which can include a single photodiode 115 (e.g., or any suitable photo sensor, such as a photogate, phototransistor, etc.), or a grouping of multiple photodiodes 115 (e.g., a set of four photodiodes).

The pixel 105 also includes additional components (in-pixel circuitry) to facilitate usage of the photo-sensor block 110 for optical sensing. As illustrated, embodiments can include a dual conversion gain (DCG) block 120, a reset block 130, a source-follower block 140, and a select block 150. Each can be implemented using at least one corresponding transistor. The reset block 130 can selectively reset the pixel 105 components. The source-follower block 140 can support conversion of outputs from the photo-sensor block 110 into an electrical signal indicative of optical information detected by the photo-sensor block 110. The select block 150 can support selection of the pixel 105 signals from among the array of pixels 105, for example responsive to a control signal received via a bus 160. For example, the bus 160 may be a column select bus, or the like.

Many applications are driving continual decreases in imaging sensor sizes, which is driving a corresponding decrease in the sizes of the imaging pixels 105. To maintain high conversion gain across a large dynamic range, some modern CIS applications use dual conversion gain (DCG), as implemented by the DCG block 120. With DCG, each imaging pixel 105 can effectively operate in either a high-gain mode to provide a higher amount of conversion gain in low-light conditions, or a low-gain mode to provide a lower amount of gain in high-light conditions (e.g., to avoid saturation, or other undesirable effects). Conventionally, as illustrated, DCG is implemented by adding a separate DCG block 120 (i.e., at least a separate DCG transistor) in the in-pixel circuitry. Turning ON the DCG transistor can effectively add well capacity to reduce conversion gain, and turning OFF the DCG transistor can effectively reduce well capacity to increase conversion gain.

Figure 2:
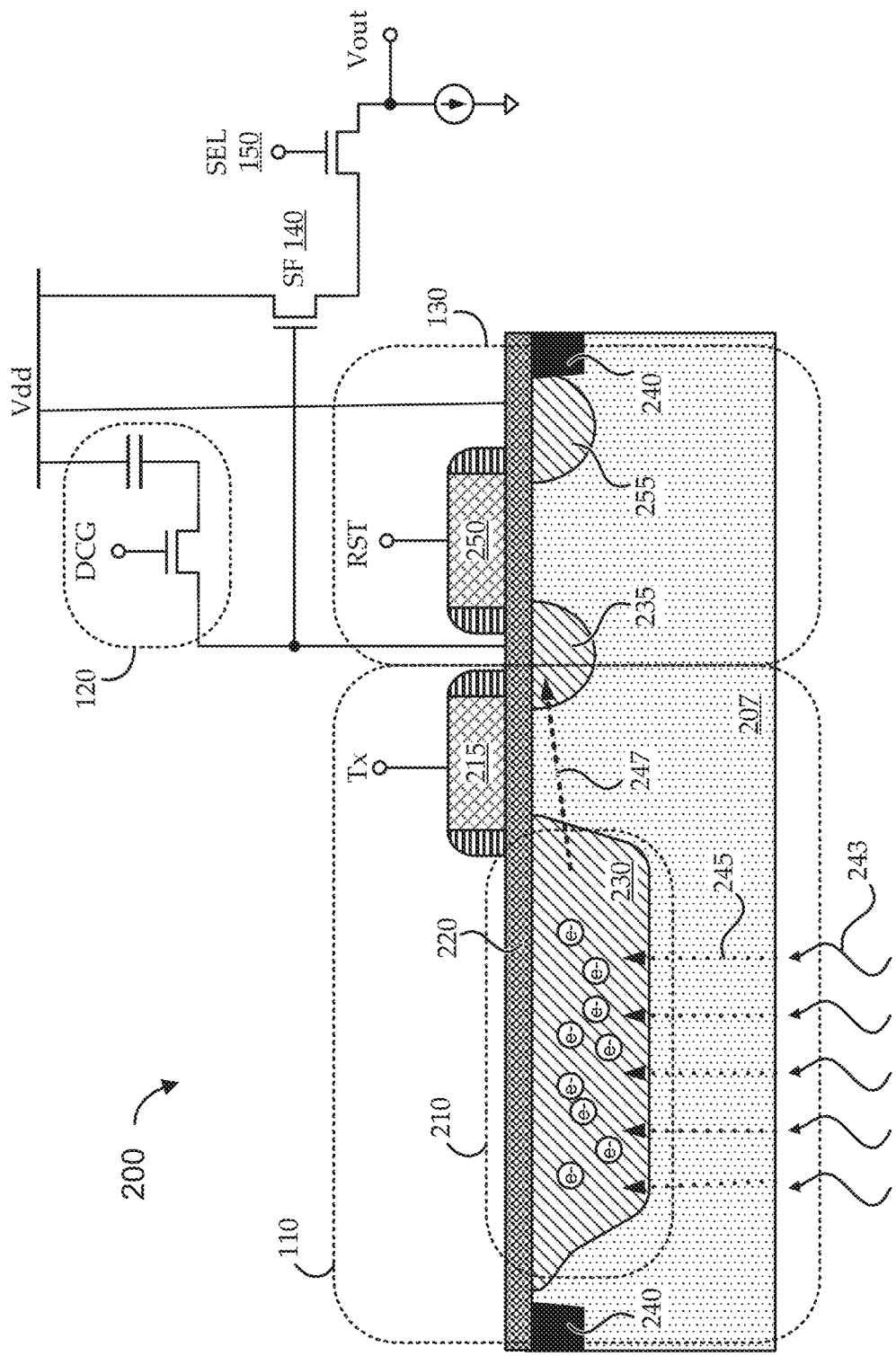
FIG. 2 shows an example of a conventional CIS imaging pixel with conventional in-pixel circuitry.

For added context, FIG. 2 shows an example of a conventional CIS imaging pixel 200 with conventional in-pixel circuitry. The pixel 200 can be an implementation of the conventional pixel 105 of FIG. 1, including implementations of the photo-sensor block 110, the DCG block 120, the reset block 130, the source follower block 140, and the select block 150. The The photo-sensor block 110 is illustrated as a simplified pinned photodiode (PPD) 210 configured for backside illumination, but similar concepts can be applied to other types of photodiode implementations. The photo-sensor block 110 and the reset block 130 (and other blocks of the pixel 200) are implemented on a semiconductor substrate 207, such as doped silicon wafer.

The photo-sensor block 110 includes a transfer gate 215 that can be activated by a Tx signal and can be isolated from the substrate 207 by an oxide layer 220. The substrate 207 can have a first doping type (e.g., P-type). The PPD 210 can be formed by implanting at least a collection region 230 of a second doping type (e.g., N-type) into the substrate 207 on one side of the transfer gate 215, and implanting a floating diffusion region 235 of the second doping type (e.g., N-type) into the substrate 207 on the other side of the transfer gate 215. Isolation regions 240 (e.g., shallow-trench isolation, STI) can be formed to electrically isolate structures of the photo-sensor block 205 from those of adjacent photo-sensor blocks and/or pixels.

As photons reach the backside of the substrate 207 (e.g., illustrated by arrows 243), they can be converted into photocarriers (i.e., electrons and holes), one of which being attracted to and collected in the collection region 230 (e.g., illustrated by dotted arrows 245). The accumulation of photocarriers in the collection region 230 can be considered generally as an accumulation of charge. For example, longer and/or brighter exposure can result in a greater accumulation of charge in the collection region 230. Activating the Tx signal can form a depletion region below the transfer gate 215, which effectively becomes a current channel between the two second-doping-type (e.g., N-type) regions: the collection region 230 and the floating diffusion region 235. As such, activation of the transfer gate 215 causes accumulated charge in the collection region 230 to transfer across the current channel to the floating diffusion region 235.

As illustrated, the in-pixel circuitry generally interfaces with the photo-sensor block 110 via the floating diffusion region 235. For example, components of the in-pixel circuitry are used to read out the accumulated charge after it is transferred to the floating diffusion region 235.

Prior to transferring the accumulated charge from the collection region 230 to the floating diffusion region 235, the reset block 130 can be used to effectively flush accumulated charge from the floating diffusion region 235 to reset the pixel 200. Transferring the accumulated charge from the collection region 230 to the floating diffusion region 235 can effectively generate a gate voltage (corresponding to the amount of accumulated charge transferred to the floating diffusion region 235) at the gate of the source follower block 140. As illustrated, the select block 150 is coupled between a source terminal of the source follower block 140 and an output voltage terminal (Vout), and a constant current source is coupled between Vout and ground. As such, when the select block 150 is activated (e.g., as part of a row select operation), an output voltage is generated at Vout based on the gate voltage at the source follower block 140 (i.e., and thus based on the accumulated charge transferred to the floating diffusion region 235).

It can be seen that the reset block 130 is implemented as a conventional MOSFET with an n-type source region (i.e., the floating diffusion region 235) and an n-type drain region 255 implanted in the semiconductor substrate 207 (e.g., p-doped silicon). A polygate structure 250 with a reset gate electrode (labeled RST) is patterned on the substrate 207 on top of the gate oxide layer 220 (i.e., a metal-oxide layer), such that the gate oxide layer 220 electrically isolates the polygate structure 250 from, and defines a channel region between, the floating diffusion (source) region 235 and the drain region 255. Applying a positive gate voltage to the reset gate terminal can attract negative charges to the channel region between the n-doped floating diffusion (source) region 235 and drain region 255, which forms an n-type current channel (turning the transistor ON). Alternatively, the drain and source regions can be p-doped regions implanted into an n-doped substrate, and applying a negative gate voltage to the gate terminal can attract positive charges to (e.g., repel the negative charges from) the channel region between the p-doped source and drain regions to form a p-type current channel (turning the transistor ON).

The gate oxide layer 220 forms a dielectric insulator layer between the polygate structure 250 and the transistor current channel, which electrically insulates the gate electrode from the semiconductor n-channel or p-channel. Conventionally, the gate oxide layer 220 is formed using a metal oxide, such as silicon dioxide. With such an insulated polygate structure 250 design, there is no current flowing through the gate electrode; rather, the voltage applied to the gate electrode generates an electric field in the channel region to control the electrical conductivity of the current channel.

Performance of an imaging sensor pixel relates to how well the pixel can convert photons into electrical charges. Such performance can depend on a number of physical and electrical characteristics of the pixel, such as well capacity, dynamic range, and conversion gain.

Well capacity relates to the amount of charge that can be held by the imaging pixel during integration (i.e., during exposure to light, prior to readout). It can be desirable to have a large dynamic range, which indicates that the pixel performs well over a large range of lighting conditions, such as from very low-light conditions up to high-light conditions (i.e., where full well capacity, or FWC, may be reached). It can also be desirable to have higher conversion gain, which indicates a larger increase in output signal voltage with any increase in accumulated charge.

Typically, the output signal level corresponds to the ratio between the accumulated charge in the well and the well capacitance. For example, a smaller well can tend to have less capacity to accumulate charge and correspondingly smaller well capacitance, which can tend to result in a larger change in output signal level for any change in charge accumulation in the well. As pixel sizes decrease, so do their well capacities. As noted above, to help maintain high conversion gain over a large dynamic range, many modern imaging sensors incorporate DCG. As illustrated in FIG. 2, such DCG is typically implemented in a conventional imaging pixel by adding a DCG block 120 that includes at least a DCG transistor (e.g., some implementations also include additional DCG transistors, capacitors, amplifiers, and/or other components). When the DCG transistor is ON, it can be seen that the DCG transistor effectively adds well capacitance (e.g., and also accumulated charge stored in the capacitor(to the floating diffusion region 235. The added well capacitance can place the DCG block 120 in a low conversion gain mode, such that changes in the amount of charge transferred to the floating diffusion region 235 have a relatively small impact on the output signal level at Vout. As a corollary, turning OFF the DCG transistor tends effectively to reduce well capacity (i.e., or not to increase it), which can place the DCG block 120 in a high conversion gain mode, such that changes in the amount of charge transferred to the floating diffusion region 235 have a relatively large impact on the output signal level at Vout.

Figure 3A:
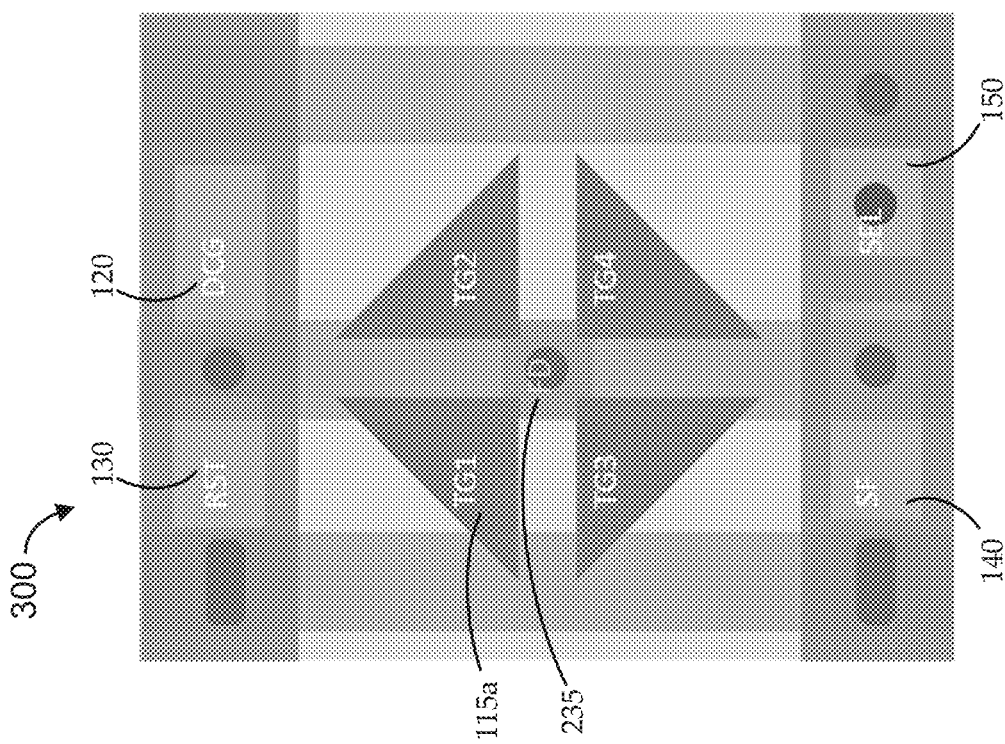
FIGS. 3A and 3B show a simplified layout view and a simplified circuit view, respectively, of another illustrative conventional implementation of a CIS imaging pixel.
Figure 3B:
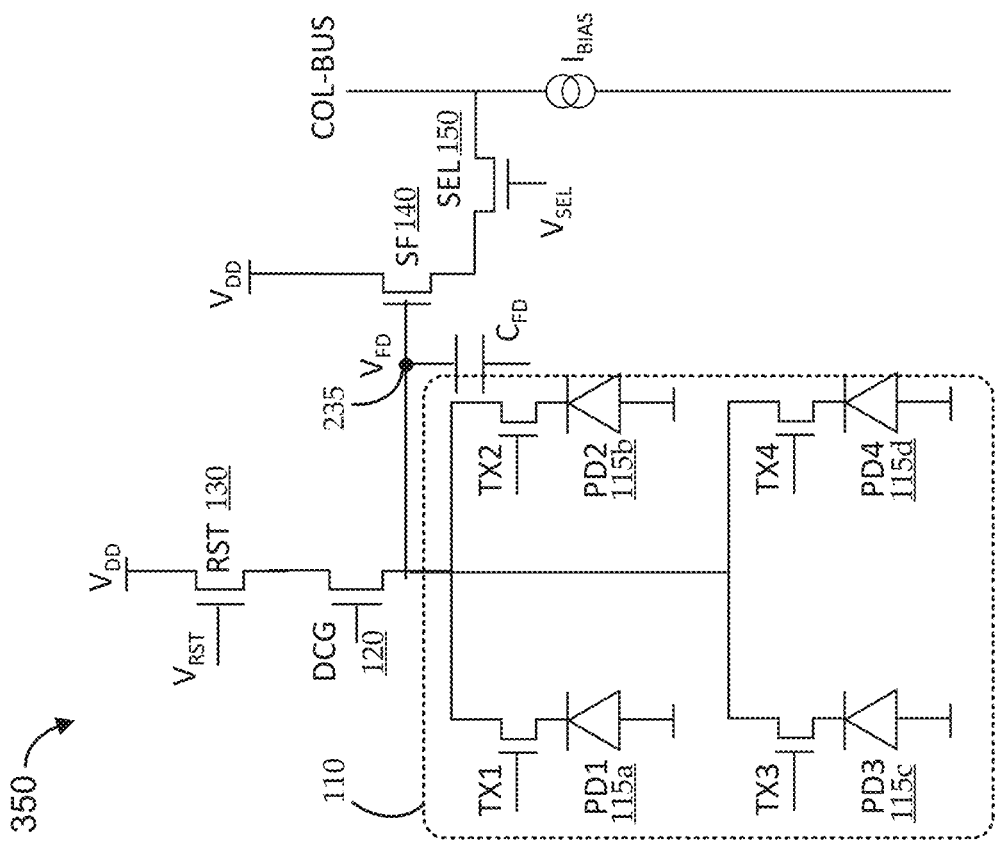

FIGS. 3A and 3B show a simplified layout view 300 and a simplified circuit view 350, respectively, of another illustrative conventional implementation of a CIS imaging pixel. As in FIGS. 1 and 2, the imaging pixel is shown having a photo-sensor block 110 (here, with four photodiodes 115), a DCG block 120, a reset block 130, a source-follower block 140, and a select block 150. In both the simplified layout view 300 and the simplified circuit view 350, it can be seen that a designated transistor is used to reset the stored photocharge in the imaging pixel (i.e., the reset block 130), and a separate designated transistor is used to provide DCG for the imaging pixel (i.e., the DCG block 120). The floating diffusion region 235 is also labeled in both views. As described above, the total capacitance of the floating diffusion region 235 and the conversion gain are modulated by the DCG block 120 (i.e., by the separate designated DCG transistor) coupled with the floating diffusion region 235 and the reset block 130. Under higher light illumination conditions, a low conversion gain mode is used to achieve a higher full well capacity and a wider dynamic range; under lower light illumination conditions, a high conversion gain mode is used to lower readout noise and achieve improved low-light sensing performance.

While conventional implementations of DCG tend to be effective, the addition of at least a DCG transistor (e.g., and a capacitor, and/or additional components) can be undesirable. For example, the space of a pixel (e.g., imaging pixel 200) is shared by the photo-sensor block 110 and the in-pixel circuitry, and any addition of in-pixel circuitry components can tend to reduce the space available to the photodiode(s) 115 of the photo-sensor block 110 and/or other components, and/or can increase complexity, process variations, etc. Embodiments disclosed herein include a novel structure that effectively combines the reset and DCG blocks into a single hybrid transistor. The hybrid transistor, referred to herein as a Fe-MOSFET combines features of a MOSFET with features of a ferroelectric field-effect transistor (Fe FET) by including a hybrid gate insulation layer that includes a dielectric segment and a Fe segment formed between the gate electrode and the channel region of a field-effect transistor. A first set of voltage levels can be applied at the gate terminal to toggle the Fe segment between a high-DCG mode and a low-DCG mode, and a second set of voltage levels can be applied at the same gate terminal to toggle the dielectric segment between a reset ON mode and a reset OFF mode in either of the DCG modes.

Figure 4:
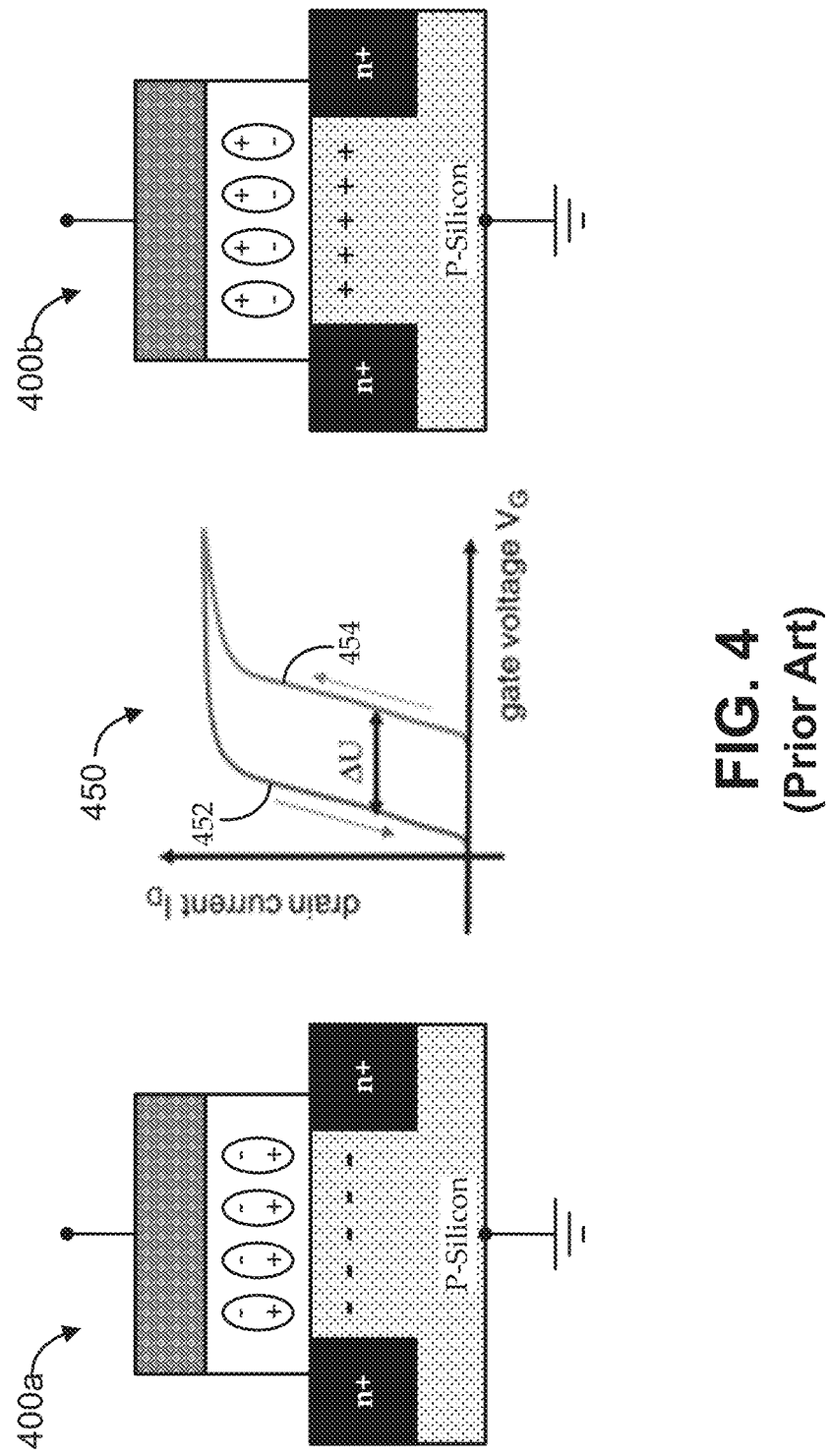
FIG. 4 demonstrates behavior of a ferroelectric (Fe) material in use as a gate insolation layer for a field-effect transistor (FET), as used in a conventional Fe-FET.

For the sake of added context, FIG. 4 demonstrates behavior of a ferroelectric (Fe) material in use as a gate insolation layer for a field-effect transistor (FET), as used in a conventional Fe-FET 400. As in a MOSFET, the Fe-FET 400 can be formed by implanting second-doping-type (e.g., n-type) drain and source regions into a first-doping-type (e.g., p-type) silicon substrate, and patterning a gate structure with a gate electrode on the substrate, isolated from the substrate and the drain and source regions by an insulation layer. In the typical metal-oxide material insulation layer of a MOSFET, charges tend to be randomly distributed, and/or otherwise unpredictable. In contrast, the insulation layer of the Fe-FET 400 uses a ferroelectric material that has dipoles that can be aligned by applying voltage of a particular polarity and magnitude across the material.

FIG. 4 shows the conventional Fe-FET 400 in two polarization states. In a first polarization state (corresponding to the Fe-FET 400a at the left side of FIG. 4), the dipoles in the Fe material are aligned with their positive sides pointing toward from the substrate, thereby attracting negative charges (e.g., attracting electrons) into the channel region between the drain and source regions. In a second polarization state (corresponding to the Fe-FET 400b at the right side of FIG. 4), the dipoles in the Fe material are aligned with their negative sides pointing toward from the substrate, thereby attracting positive charges (e.g., attracting holes, repelling electrons, etc.) into the channel region between the drain and source regions. In the illustrated NPN doping configuration (i.e., with a p-doped substrate and n-doped source and drain regions), turning ON the transistor involves applying a high enough voltage to the gate terminal to form an n-channel. In the left-hand polarization state represented by Fe-FET 400a (where there are already negative charges attracted by the Fe material to the channel region), the n-channel can be formed with the addition of only a relatively small positive gate voltage. As such, in that state, the switching voltage (e.g., the threshold voltage, or Vth) is relatively low. However, in the right-hand polarization state represented by Fe-FET 400*a* (where negative charges are being pushed away from the channel region by the Fe material), forming the n-channel can involve adding a relatively large positive gate voltage. As such, in that state, the switching voltage is relatively high.

A drain current-gate voltage diagram 450 shows the dependence of the drain current in the vertical axis and the gate voltage in the horizontal axis under the two different ferroelectric states. Curve 452 shows the drain current-gate voltage relationship for the polarization state (ferroelectric state) represented by Fe-FET 400*a*, and curve 454 shows the drain current-gate voltage relationship for the polarization state (ferroelectric state) represented by Fe-FET 400*b*. As illustrated by the drain current-gate voltage diagram 450, the Fe-FET 400 is relatively bi-stable device with a relatively large separation between the Vth level in each polarization state. Because of that property, such Fe-FET 400 devices tend to be used to construct low power, non-volatile memory with fast random access, known as Ferroelectric Random Access Memory (FRAM), with improved multiple read-and-write performance.

Figure 5:
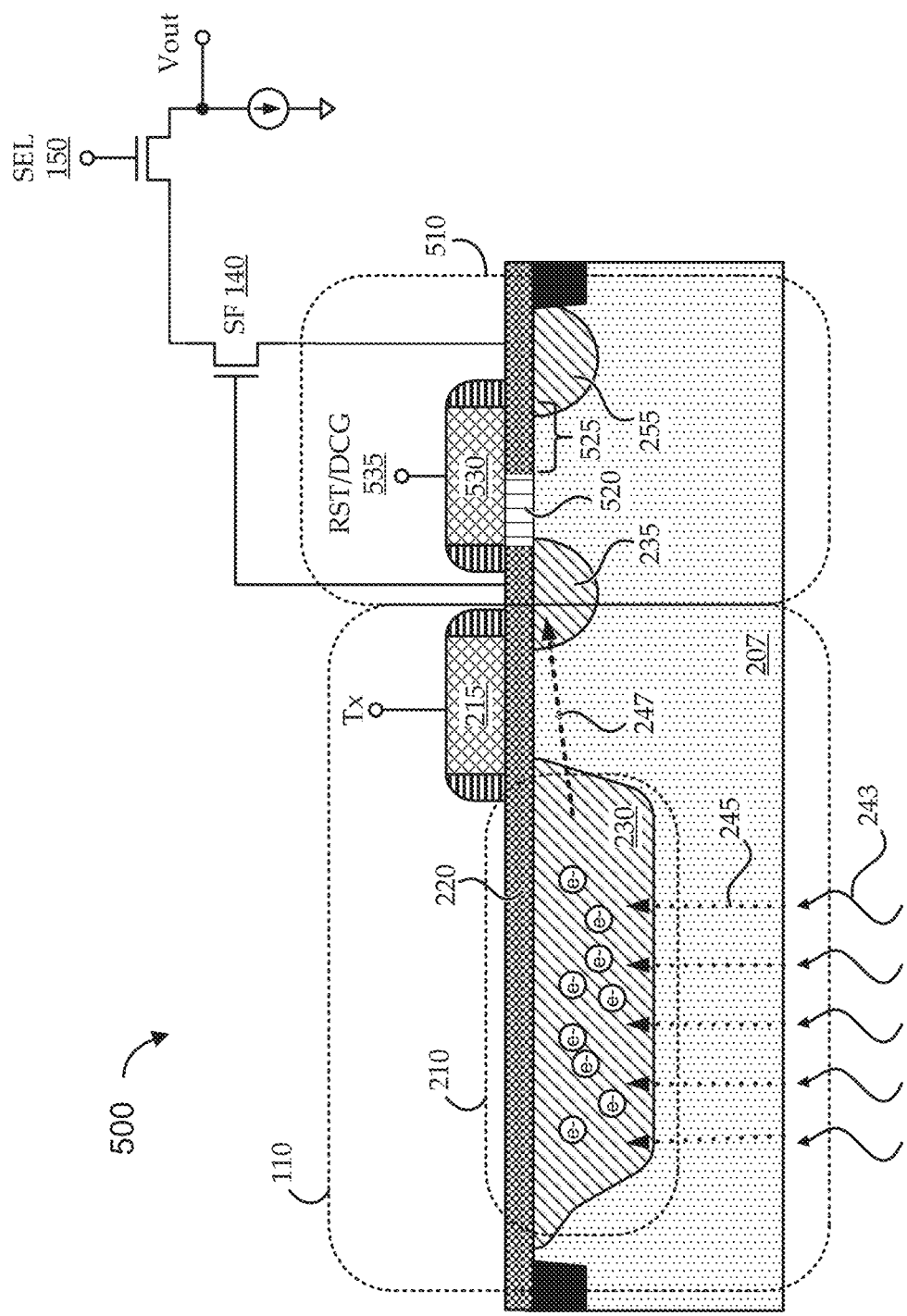
FIG. 5 shows a CIS imaging pixel that incorporates in-pixel circuitry having an illustrative hybrid reset-DCG (HRD) block implemented with a novel Fe-MOSFET structure, according to various embodiments described herein.

As noted above, embodiments described herein include a novel hybrid structure referred to herein as a Fe-MOSFET. FIG. 5 shows a CIS imaging pixel 500 that incorporates in-pixel circuitry having an illustrative hybrid reset-DCG (HRD) block 510 implemented with a novel Fe-MOSFET structure, according to various embodiments described herein. As in FIG. 2, the imaging pixel 500 includes a photo-sensor block 110 (illustrated as including a conventional PPD 210), a source-follower block 140, and a select block 150. Unlike in FIG. 2, the in-pixel circuitry does not include a designated reset block and a separate designated DCG block. Instead, the in-pixel circuitry includes the HRD block 510 to effectively implement both reset block and DCG block features.

As illustrated, the Fe-MOSFET structure of the HRD block 510 is formed by implanting source and drain regions into a semiconductor substrate 207. For example, the substrate 207 is p-doped, and the source and drain regions are n-doped; or the substrate 207 is n-doped, and the source and drain regions are p-doped. The source region corresponds to the floating diffusion region 235 of the photo-sensor block 110. A polygate structure 530 with a reset-DCG electrode 535 (labeled RST-DCG 535) is patterned on the substrate 207 on top of an isolating layer, such that the isolating layer electrically isolates the polygate structure 530 from, and defines a channel region between, the floating diffusion (source) region 235 and the drain region 255. In some implementations, the drain region 255 is coupled with a voltage reference (e.g., Vdd).

As illustrated, the isolating layer below the polygate structure 530 includes a Fe segment 520 and a dielectric segment 525. The Fe segment 520 is formed by depositing a layer of ferroelectric material, as described above. Various suitable materials may be used to form the hybrid structure. For example, the Fe material may include HfZrO, PbTiO, BiTiO, etc. The dielectric segment 525 is formed by depositing a layer of metal-oxide. For example, the dielectric segment 525 is a portion a gate oxide layer 220, and/or is manufactured concurrent with other portions of the gate oxide layer 220. In effect, a first portion of the channel region is directly below the Fe segment 520, and a second (non-overlapping) portion of the channel region is directly below the dielectric segment 525. In one implementation, approximately half of the channel region is directly below the Fe segment 520, and the remaining approximate half of the channel region is directly below the dielectric segment 525. The dielectric segment 525 can include any suitable metal oxide, or high-k dielectric material. For example, the dielectric segment can be made of silicon dioxide with a dielectric constant k around 3.9, and/or other suitable dielectric materials, such as a high-k dielectric material exhibiting its k value above 10 (e.g., HfSiO4 with a k around 11, hafnium oxide or zirconium dioxide with a k around 25, titanium dioxide with a k around 22, etc.). The reset-DCG electrode 535 can include a suitable electrically conductive material such as a doped dielectric material (e.g., polysilicon) and a suitable one or more metals. To achieve high speed FETs, the dielectric segment 525 can be a high-k dielectric and the polygate structure 530 can be a metal gate with one or more metal layers.

A control voltage signal can be applied at the reset-DCG electrode 535 to control both the reset and DCG features of the HRD block 510. For example, applying a relatively large-magnitude voltage to the reset-DCG electrode 535 in a first polarity can cause the dipoles in the Fe segment 520 to align with their positive ends pointing toward the channel region. This can cause negative charges to be attracted into the portion of the channel region that is directly below the Fe segment 520 and is adjacent to the floating diffusion region 235, thereby effectively adding well capacity to that of the floating diffusion region 235 and setting the HRD block 510 to a low conversion gain mode. Applying a relatively large-magnitude voltage to the reset-DCG electrode 535 in a second (opposite) polarity can cause the dipoles in the Fe segment 520 to align with their negative ends pointing toward the channel region. This can cause negative charges to be pushed away from the portion of the channel region that is directly below the Fe segment 520, thereby not adding well capacity to the floating diffusion region 235 and setting the HRD block 510 to a high conversion gain mode. In either conversion gain mode, a lower-magnitude voltage can be applied to the reset-DCG electrode 535 to control formation of a current channel in the portion of the channel region that is directly below the dielectric segment 525, thereby controlling the reset features of the HRD block 510.

Figures 6A, 6B:
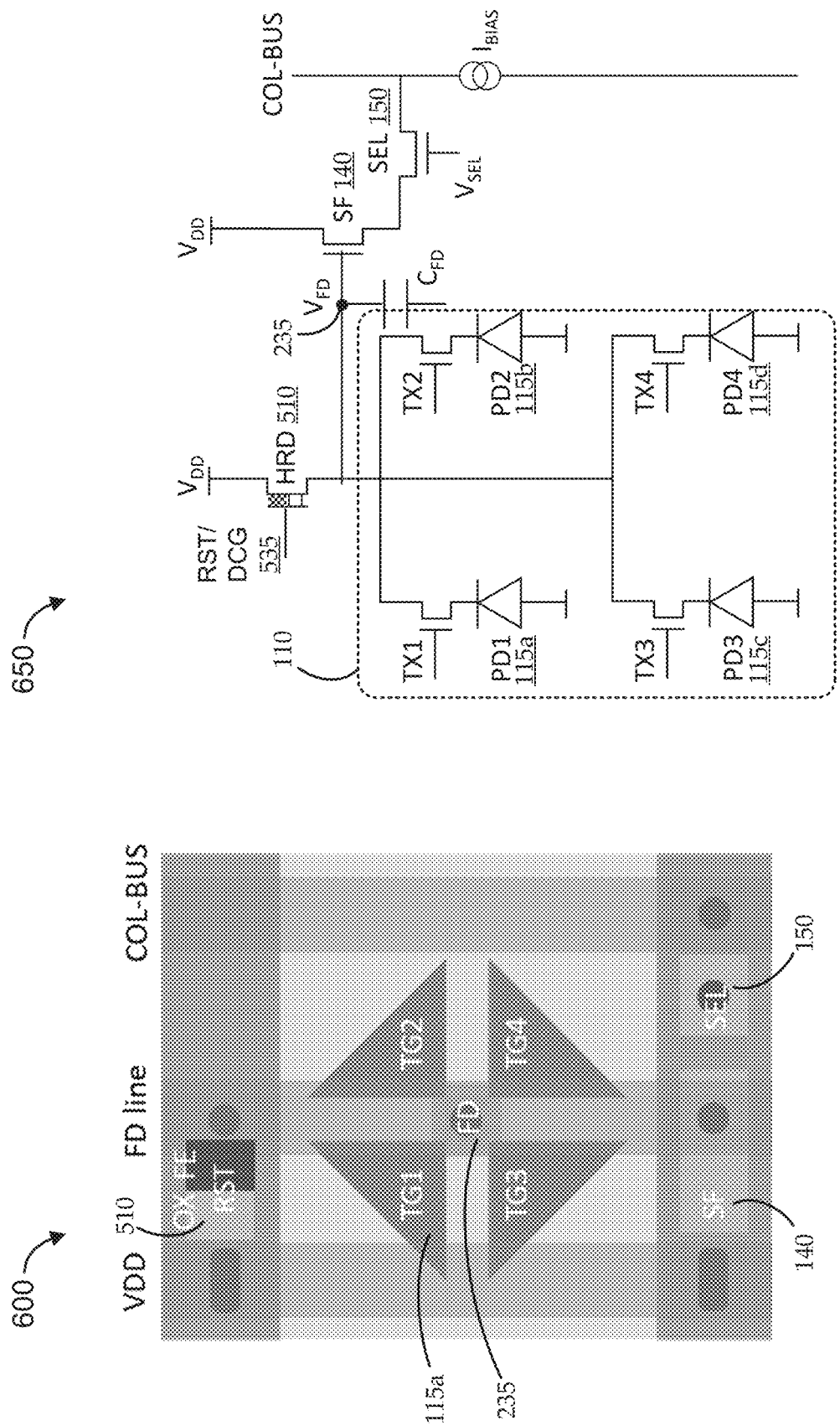
FIGS. 6A and 6B show a simplified layout view and a simplified circuit view, respectively, of an illustrative implementation of a novel CIS imaging pixel with a HRD block 510, according to various embodiments described herein.

FIGS. 6A and 6B show a simplified layout view 600 and a simplified circuit view 650, respectively, of an illustrative implementation of a novel CIS imaging pixel with a HRD block 510, according to various embodiments described herein. As described with reference to FIG. 5, the novel CIS imaging pixel includes a photo-sensor block 110 (here, with four photodiodes 115), a source-follower block 140, a select block 150, and a HRD block 510. In both the simplified layout view 600 and the simplified circuit view 650, it can be seen that a single transistor structure (i.e., a Fe-MOSFET) is used both for resetting the stored photocharge in the imaging pixel and for providing DCG for the imaging pixel. The floating diffusion region 235 is also labeled in both views. As described above, the total capacitance of the floating diffusion region 235 and the conversion gain are modulated by the toggling the ferroelectric polarization state of the Fe-MOSFET in the HRD block 510. Under higher light illumination conditions, a low conversion gain mode is used to achieve a higher full well capacity and a wider dynamic range; under lower light illumination conditions, a high conversion gain mode is used to lower readout noise and achieve improved low-light sensing performance.

Figure 7A:
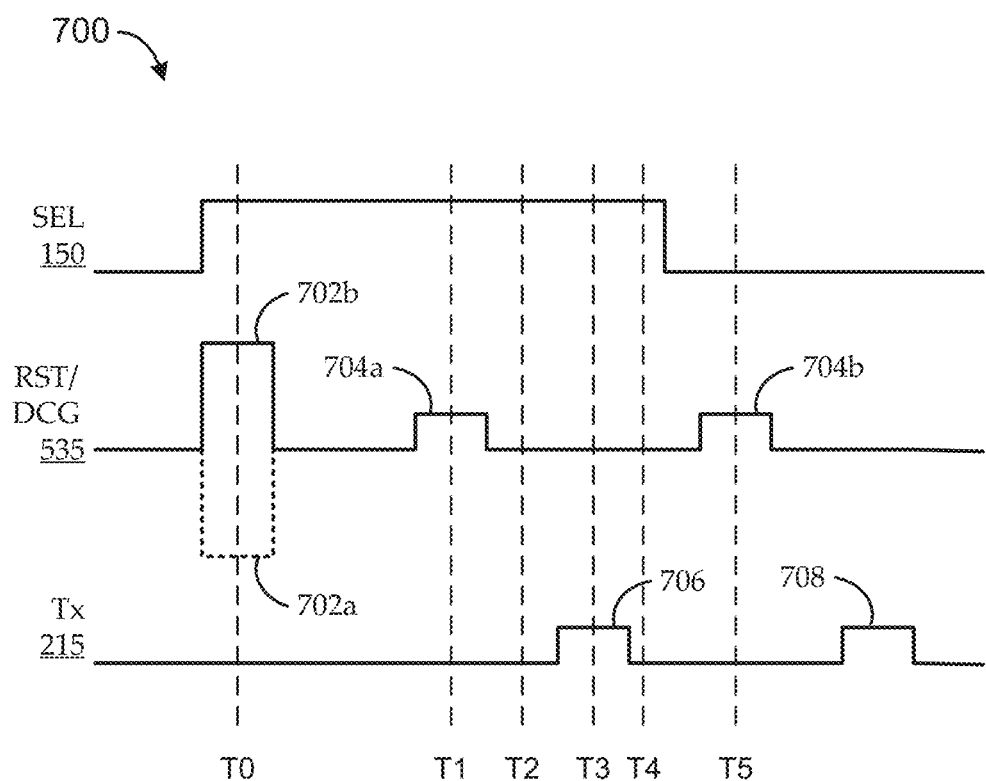
FIG. 7A shows an example of a simplified timing diagram for directing operation of the HRD block, according to various embodiments described herein.

FIG. 7A shows an example of a simplified timing diagram 700 for directing operation of the HRD block 510, according to various embodiments described herein. In particular, the timing diagram includes illustrative timing for a select control signal applied to the select block 150 (e.g., a gate voltage applied to the select transistor of the select block 150), a control signal applied at the reset-DCG electrode 535 of the HRD block 510, and a control signal applied at the gate terminal of the transfer gate 215. The timing diagram 700 includes two identical cycles of a periodic signaling protocol, each cycle having six particular time locations identified (labeled "T0"-"T5").

Figure 7B:
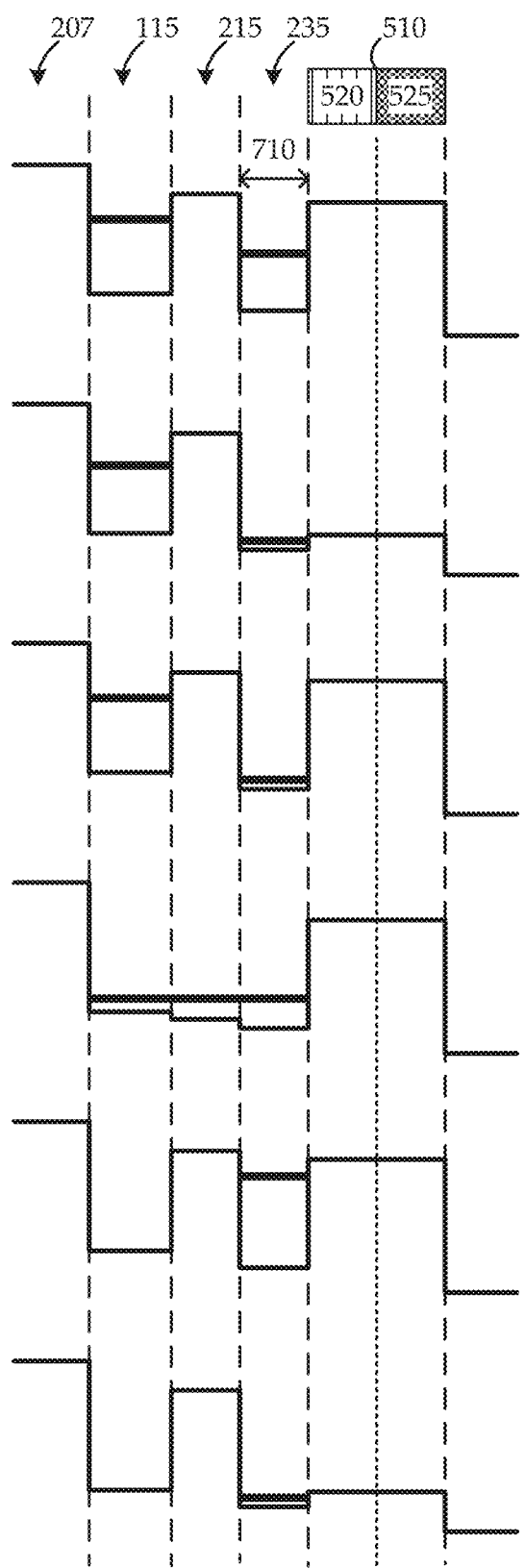
FIG. 7B shows a sequence of simplified energy band diagrams over the time locations identified in FIG. 7A for a case in which the Fe segment of the HRD block is set to a high conversion gain mode.
Figure 7C:
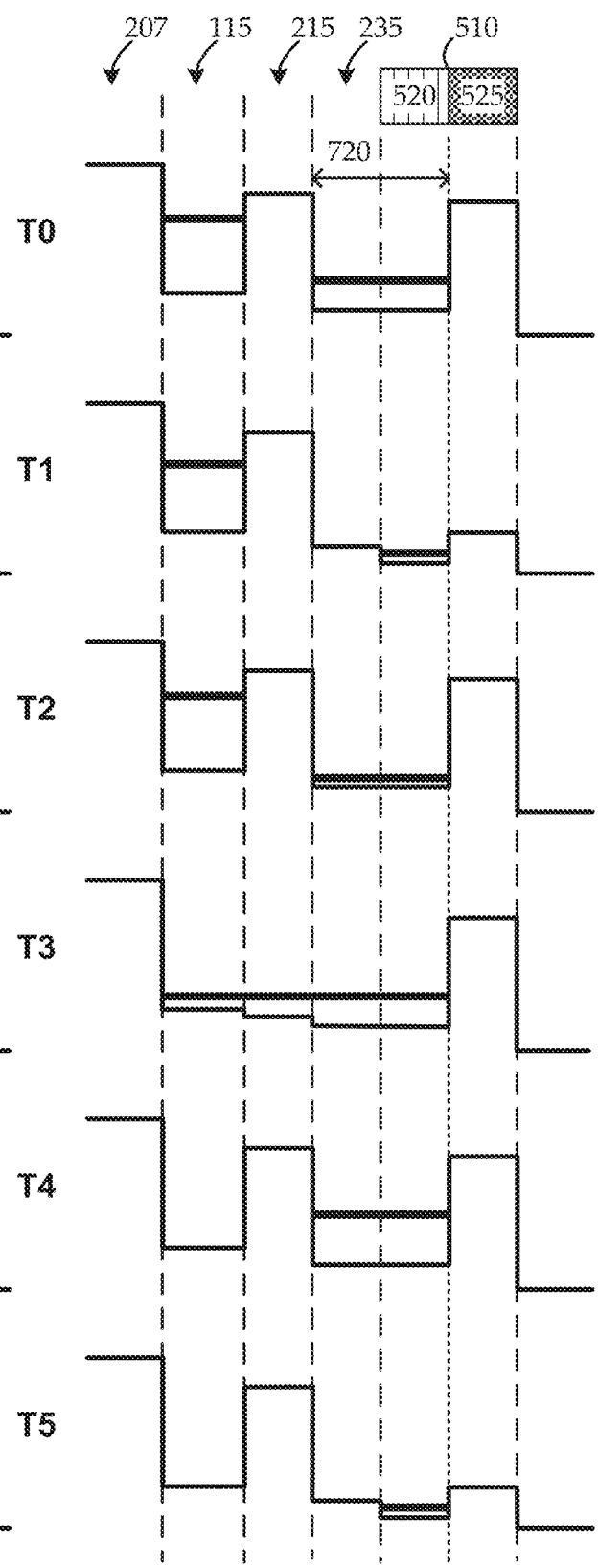
FIG. 7C shows a sequence of simplified energy band diagrams over the time locations identified in FIG. 7A for a case in which the Fe segment of the HRD block is set to a low conversion gain mode.

For added clarity, FIG. 7B shows a sequence of simplified energy band diagrams over the time locations identified in FIG. 7A for a case in which the Fe segment 520 of the HRD block 510 is set to a high conversion gain mode, and FIG. 7C shows a sequence of simplified energy band diagrams over the time locations identified in FIG. 7A for a case in which the Fe segment 520 of the HRD block 510 is set to a low conversion gain mode. FIGS. 7B and 7C are discussed in parallel with the discussion of FIG. 7A. For example, the top-most energy band diagram in each of FIGS. 7B and 7C corresponds to the energy band diagrams at time T0, as labeled; the sequence proceeds down the drawing sheet until the bottom-most energy band diagram in each of FIGS. 7B and 7C corresponds to the energy band diagrams at time T5, as labeled. Vertical dashed lines in each energy band diagram indicate approximate structural boundaries. For example, each energy band diagram indicates an energy band corresponding to the semiconductor substrate 207, the photodiode 115 (e.g., the PPD 210) of the photo-sensor block 110, the transfer gate 215 of the photo-sensor block 110, the floating diffusion region 235 shared by the photo-sensor block 110 and the HRD block 510, and the HRD block 510. Within the HRD block 510, a dashed line separately indicates energy bands directly below the Fe segment 520 and the dielectric segment 525. Thick horizontal lines in the energy band diagrams indicates an illustrative amount of accumulated charge in particular structural regions.

At the beginning of each cycle, the control signal for the select block 150 is asserted to turn the select block 150 ON. For example, the row corresponding to the particular pixel being signaled is presently selected. At T0, FIG. 7A shows a relatively large "write" pulse 702a being applied at the reset-DCG electrode 535 to select a ferroelectric polarization state of the Fe segment 520 of the HRD block 510 (i.e., of the Fe-MOSFET). The first energy band diagram of FIG. 7B illustrates the case where a high-magnitude, negative-polarity write pulse 702 sets the Fe segment 520 to a ferroelectric polarization state that manifests a relatively small FWC (indicated by arrow 710). For example, the write pulse orients the dipoles of the Fe segment 520 material with their negative ends pointing toward the channel region, thereby repelling negative charges from the channel region. In such an orientation, the effective FWC can be substantially the same as, or smaller than that of the floating diffusion region 235 itself. In comparison, the first energy band diagram of 7C illustrates the case where a high-magnitude, positive-polarity write pulse 702b sets the Fe segment 520 to a ferroelectric polarization state that manifests a relatively large FWC (indicated by arrow 720). For example, the write pulse orients the dipoles of the Fe segment 520 material with their positive ends pointing toward the channel region, thereby attracting negative charges from the channel region. In such an orientation, the effective FWC is larger than that of the floating diffusion region 235 itself. It can be seen in the energy band diagrams of both of FIGS. 7C and 7D that there may be accumulated charge in the photodiode 115 (e.g., in the collection region), and there may also be some accumulated charge in the floating diffusion region 235 (e.g., from a previous transfer of charge in a previous cycle).

At T1, FIG. 7A shows a first reset pulse 704a being applied at the reset-DCG electrode 535. It can be seen that the reset pulses 704 are appreciably lower magnitude than that of the write pulses 702, such that the reset pulses 704 do not toggle the ferroelectric polarization state of the Fe segment 520. The second energy band diagrams of both of FIGS. 7B and 7C show that the first reset pulse 704a results in a significant drop in the energy bands associated with the HRD block 510. Substantially all of the accumulated charge that was left in the floating diffusion region 235 from a previous cycle is flushed out of the floating diffusion region 235. In some cases, as illustrated, a small amount of accumulated charge can remain in the floating diffusion region 235 and/or in the additional well capacity below the Fe segment 520 in low conversion gain mode.

T2 of FIG. 7A illustrates a time after the first reset pulse 704a, but prior to charge transfer across the transfer gate 215. At T2, the first reset pulse 704a is no longer asserted. As can be seen in the third energy band diagrams of both of FIGS. 7B and 7C, the energy bands at the various structural regions are returned to levels similar to those of the energy band diagrams at T0, except that substantially all of the previously accumulated charge has been flushed out of the floating diffusion region 235.

At T3, FIG. 7A shows a transfer pulse 706 being applied at the gate electrode of the transfer gate 215 to turn the transfer gate 215 ON. The fourth energy band diagrams of both of FIGS. 7B and 7C show that the transfer pulse 706 results in a significant drop in the energy band associated with the transfer gate 215 (regardless of ferroelectric polarization state). As a result, the accumulated charge effectively flows out of the transfer gate 215 and into at least the floating diffusion region 235. In the high conversion gain mode, as can be seen in the fourth energy band diagram of FIG. 7B, the charge previously accumulated in the transfer gate 215 (e.g., from exposure of the photo-sensor block 110 to light) flows out of the transfer gate 215 and into the floating diffusion region 235 based on the capacity of the floating diffusion region 235. In the low conversion gain mode, as can be seen in the fourth energy band diagram of FIG. 7C, the charge previously accumulated in the transfer gate 215 flows out of the transfer gate 215 and into the expanded-capacity well provided by both the floating diffusion region 235 and the region below the Fe segment 520.

At T4, FIG. 7A shows the transfer pulse 706 having been de-asserted to turn the transfer gate 215 back OFF. At this point, the accumulated charge can be read out by readout structures (e.g., via the source-follower block 140). As can be seen in the fifth energy band diagrams of both of FIGS. 7B and 7C, the energy bands at the various structural regions are returned to levels similar to those of the energy band diagrams at T2, with the transferred charge effectively trapped in either the floating diffusion region 235 in the high conversion gain mode, or the expanded-capacity well provided by both the floating diffusion region 235 and the region below the Fe segment 520 in the low conversion gain mode.

At T5, FIG. 7A shows a second reset pulse 704b being applied at the reset-DCG electrode 535. The sixth energy band diagrams of both of FIGS. 7B and 7C show that the second reset pulse 704b results substantially the same change in energy bands as described with reference to T1. This causes a flushing out of substantially all of the accumulated charge that was transferred into either the floating diffusion region 235 in the high conversion gain mode, or the expanded-capacity well provided by both the floating diffusion region 235 and the region below the Fe segment 520 in the low conversion gain mode. As illustrated in FIG. 7A, some embodiments of the timing diagram 700 can also include a shutter pulse 708.

By comparing the energy band diagrams of FIG. 7B with the energy band diagrams of FIG. 7C, it can be seen that the reset features of the HRD block 510 operate in substantially the same manner, regardless of the ferroelectric polarization state of the Fe segment 520. However, when the Fe segment 520 is set to the high conversion gain mode, there is effectively a smaller FWC associated with the floating diffusion region 235, and there is a higher energy barrier associated with applying a zero-voltage level to the reset-DCG electrode 535. As a corollary, when the Fe segment 520 is set to the low conversion gain mode, there is effectively a larger FWC associated with the floating diffusion region 235 (with the additional well capacity formed below the Fe segment 520), and there is a lower energy barrier associated with applying a zero-voltage level to the reset-DCG electrode 535. This can be seen more clearly in FIGS. 8A and 8B.

Figure 8A:
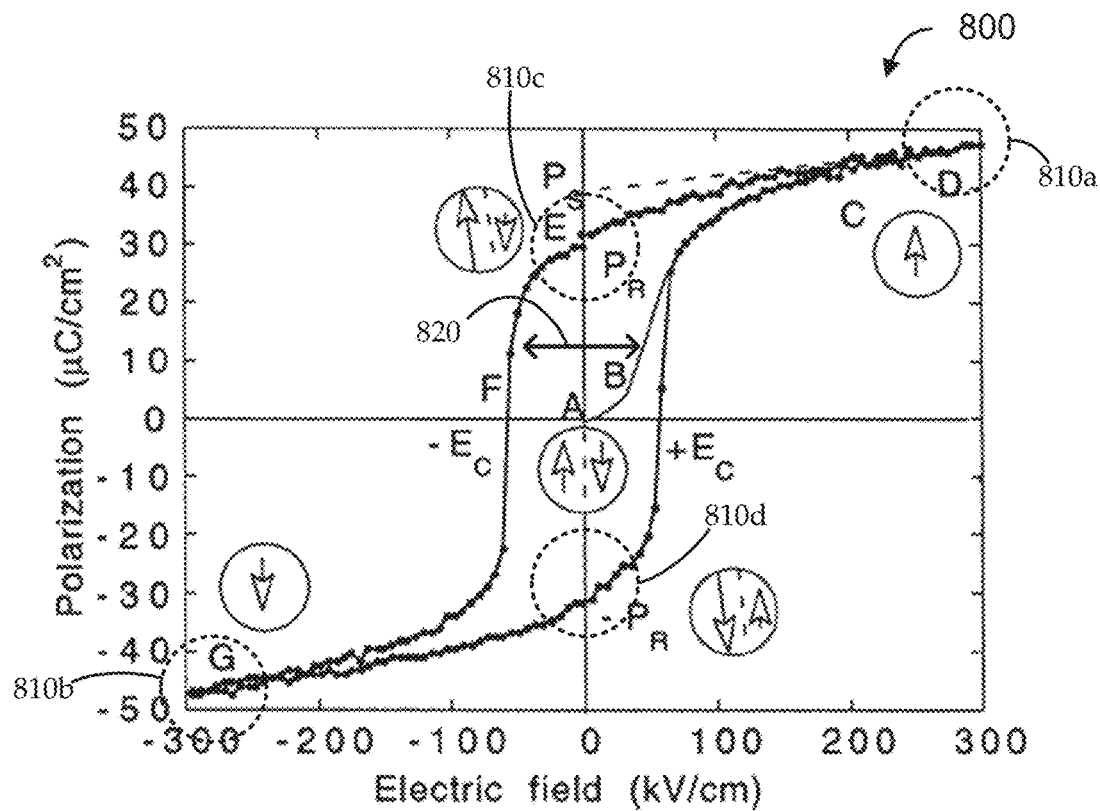
FIG. 8A shows an illustrative plot of electric field magnitude versus polarization for the Fe-MOSFET structures used in embodiments of the HRD block described herein.
Figure 8B:
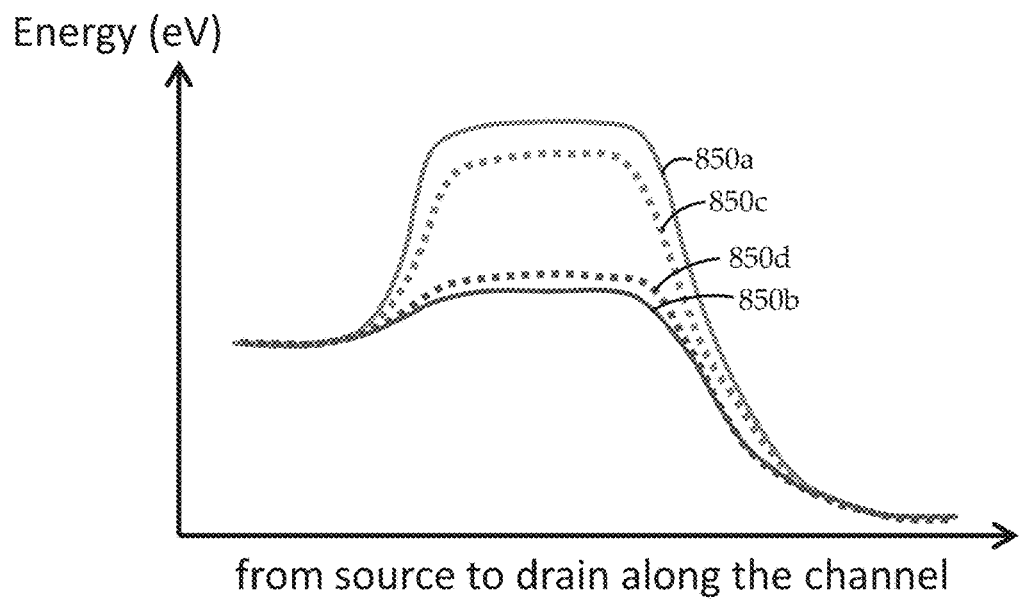
FIG. 8B shows corresponding energy band diagrams for each of four states on the plot of FIG. 8A.

FIG. 8A shows an illustrative plot 800 of electric field magnitude versus polarization for the Fe-MOSFET structures used in embodiments of the HRD block 510 described herein. FIG. 8B shows corresponding energy band diagrams 850 for each of four states on the plot 800 of FIG. 8A. As described above, a relatively high voltage in either polarization can be applied at the reset-DCG electrode 535 to write the Fe segment 520 to either of two ferroelectric polarization states. Once set to a particular ferroelectric polarization state, a lower magnitude voltage signal can be applied at the reset-DCG electrode 535 to turn the channel ON or OFF (e.g., similar to a conventional MOSFET). Referring to FIG. 8A, four illustrative states 810 of the Fe-MOSFET structure are shown. At a first state 810a a high-magnitude, positive-polarity voltage is applied at the reset-DCG electrode 535 to write the Fe segment 520 to the high conversion gain mode. Referring to FIG. 8B, the corresponding energy band diagram 850a shows a relatively high energy band in the channel region of the Fe-MOSFET. At a second state 810b illustrated in FIG. 8A, a high-magnitude, negative-polarity voltage is applied at the reset-DCG electrode 535 to write the Fe segment 520 to the low conversion gain mode. Referring to FIG. 8B, the corresponding energy band diagram 850b shows a relatively low energy band in the channel region of the Fe-MOSFET.

The third state 810c and fourth state 810d illustrated in FIG. 8A correspond to the writing pulse being turned off after writing the Fe segment 520 to the high conversion gain mode or the low conversion gain mode, respectively. Referring to the third state 810c, the writing pulse is turned off after achieving state 810a (i.e. setting the device to the high conversion gain mode), which can cause a slight disorientation of the dipoles in the Fe segment 520 to drop the energy band by a relatively small amount. In this state 810c, it can be seen that the energy barrier in the Fe segment 520 remains high even with a zero-voltage level applied to the reset-DCG electrode 535. This is also evident in the corresponding energy band diagram 850c shown in FIG. 8B. Similarly, in the fourth state 810d, the writing pulse is turned off after achieving state 810b (i.e. setting the device to the low conversion gain mode), which can cause a slight disorientation of the dipoles in the Fe segment 520 to pump up the energy band by a relatively small amount. In this state 810d, it can be seen that the energy barrier in the Fe segment 520 remains low even with a zero-voltage level applied to the reset-DCG electrode 535. This is also evident in the corresponding energy band diagram 850d shown in FIG. 8B.

In effect, it can be see that asserting a relatively high-magnitude pulse writes the Fe segment 520 into one or the other of two ferroelectric polarization states, corresponding to a high or low conversion gain mode. After de-asserting the pulse, the device remains in the corresponding high or low conversion gain mode. In that state (e.g., state 810c or 801d), there is a range of voltage levels (illustrated by arrow 820) that can be applied to the reset-DCG electrode 535 to turn the channel ON or OFF without toggling the ferroelectric polarization state of the device. As such, both the DCG and reset features of the HRD block 510 can be controlled by applying voltage signals at the same reset-DCG electrode 535 with different magnitudes and polarities, for example, as described with reference to the timing diagram 700 of FIG. 7A.

Figure 9:
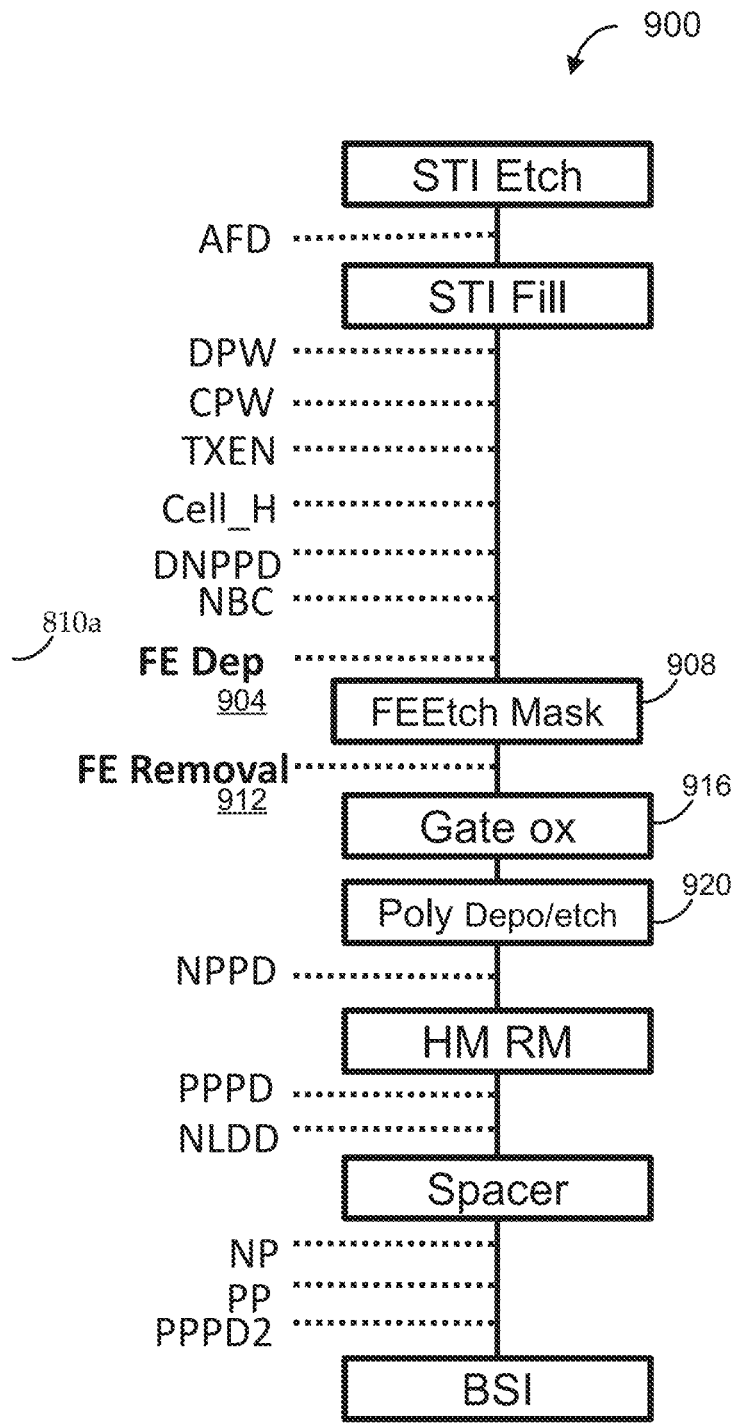
FIG. 9 shows an example flow diagram for a process by which to fabricate a Fe-MOSFET structure, according to various embodiments described herein.

As described above, embodiments of the HRD block 510 incorporate a novel hybrid Fe-MOSFET structure. Embodiments can further include a novel fabrication process for fabricating the Fe-MOSFET structure. FIG. 9 shows an example flow diagram for a process 900 by which to fabricate a Fe-MOSFET structure, according to various embodiments described herein. Some portions of the fabrication process can be similar to those used for fabricating conventional MOSFETs. However, unlike in conventional MOSFET fabricating processes, fabrication of the Fe-MOSFET structure can involve depositing and patterning (e.g., etching) a ferroelectric material layer in addition to forming (e.g., growing) the metal oxide layer.

In the illustrated fabrication process 900, the ferroelectric material layer is deposited prior to forming the metal oxide layer. In particular, as illustrated, the ferroelectric material layer is deposited at stage 904. At stage 908, an etching mask can be applied on top of the region of the deposited ferroelectric material corresponding to the Fe segment 520. At stage 912, portions of the ferroelectric material layer not shielded by the etching mask are removed to leave behind only the Fe segment 520. At stage 916, a gate oxide layer can be formed to include at least the portion adjacent to the Fe segment 520 and corresponding to the dielectric segment 525. At stage 920, a gate material (e.g., polysilicon) can be deposited and etched to form the polygate structure 530 on top of the Fe segment 520 and the dielectric segment 525.

Figure 10:
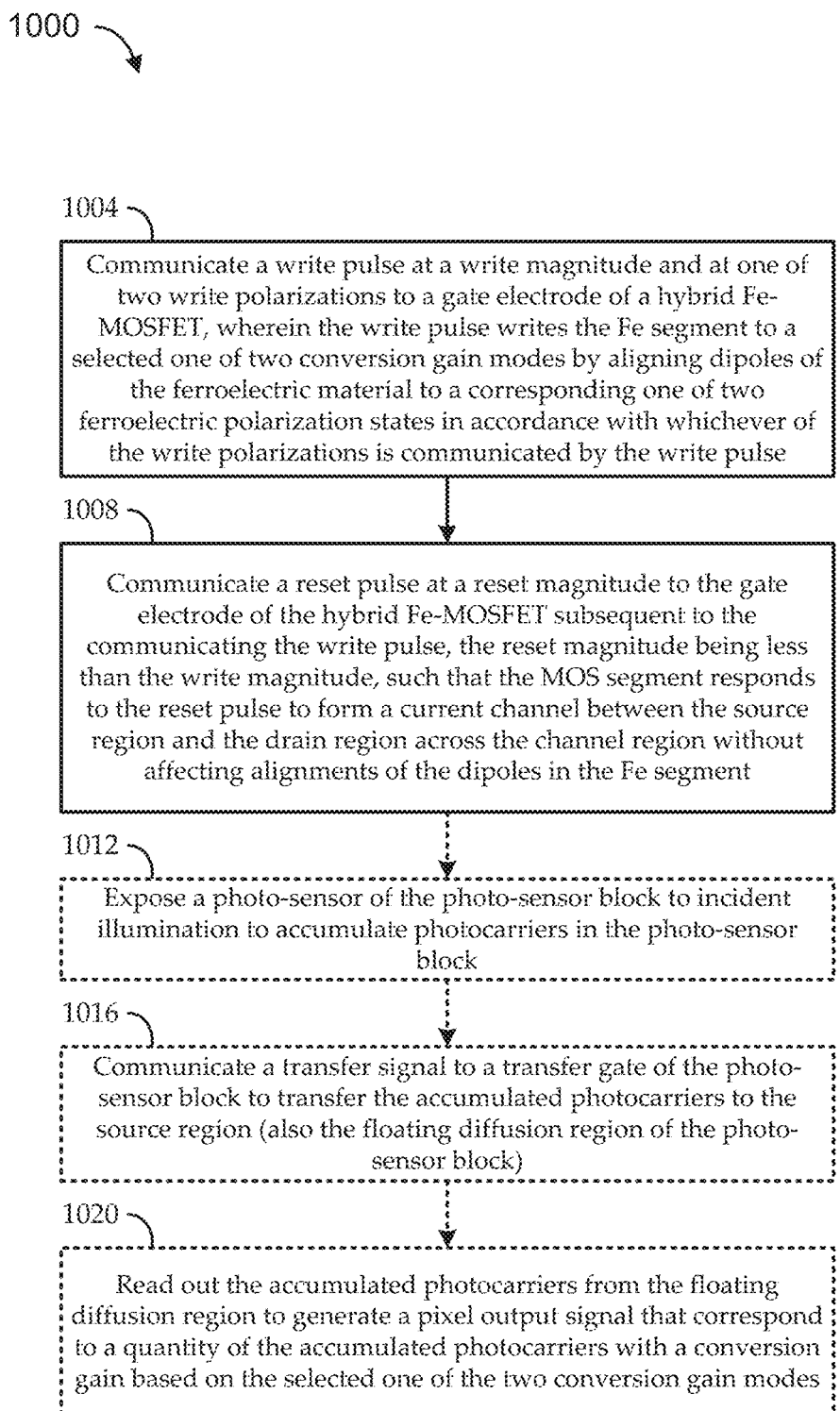
FIG. 10 shows a flow diagram of an illustrative method for generating a pixel output signal with dual conversion gain in a complementary metal-oxide semiconductor (CMOS) imaging sensor (CIS), according to various embodiments described herein.

FIG. 10 shows a flow diagram of an illustrative method 1000 for generating a pixel output signal with dual conversion gain in a complementary metal-oxide semiconductor (CMOS) imaging sensor (CIS), according to various embodiments described herein. Embodiments of the method 1000 can be performed using embodiments of the hybrid reset-DCG block described above, including using features of a hybrid Fe-MOSFET. Some embodiments of the method 1000 correspond to the timing diagram 700 of FIG. 7A.

Embodiments can begin at stage 1004 by communicating a write pulse at a write magnitude and at one of two write polarizations to a gate electrode of the hybrid Fe-MOSFET. The write pulse writes the Fe segment of the Fe-MOSFET to a selected one of two conversion gain modes by aligning dipoles of the ferroelectric material to a corresponding one of two ferroelectric polarization states in accordance with whichever of the write polarizations is communicated by the write pulse. For example, a write pulse of a first write polarization aligns the dipoles in a first orientation that corresponds to a low conversion gain mode, and a write pulse of a second write polarization aligns the dipoles in a second orientation that corresponds to a high conversion gain mode.

At stage 1008, embodiments can communicate a reset pulse at a reset magnitude to the gate electrode of the hybrid Fe-MOSFET subsequent to the communicating the write pulse. The reset magnitude is appreciably less than the write magnitude (e.g., below half), such that the dielectric segment responds to the reset pulse to form a current channel between the source region and the drain region across the channel region, without affecting alignments of the dipoles in the Fe segment. For example, as described above, after the write pulse ends, the Fe segment effectively relaxes into one of two stable states, in which a range of voltages can be applied to the gate electrode without toggling the state of the Fe segment.

In some embodiments, the source region of the Fe-MOSFET is a floating diffusion region of a photo-sensor block (e.g., supported by a same semiconductor substrate). In such embodiments, at stage 1012, the method 1000 can expose a photo-sensor of the photo-sensor block to incident illumination to accumulate photocarriers in the photo-sensor block. At stage 1016, such embodiments can communicate a transfer signal to a transfer gate of the photo-sensor block to transfer the accumulated photocarriers to the floating diffusion region subsequent to communicating the write pulse and the reset pulse. Some such embodiments, at stage 1020, can further read out the accumulated photocarriers from the floating diffusion region to generate a pixel output signal. The pixel output signal is generated to correspond to a quantity of the accumulated photocarriers with a conversion gain based on the selected one of the two conversion gain modes.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A complementary metal-oxide semiconductor (CMOS) imaging sensor (CIS) comprising:
   an imaging pixel comprising:
   a semiconductor substrate doped according to a first doping type;
   a photo-sensor block comprising at least one photodiode configured to accumulate photocarriers responsive to exposure to illumination and to transfer the accumulated photocarriers to a floating diffusion region for readout, the floating diffusion region formed by implanting a first well of a second doping type into the semiconductor substrate, the second doping type being different from the first doping type; and
   a hybrid ferroelectric-metal-oxide-semiconductor field effect transistor (Fe-MOSFET) device comprising:
   a drain region formed by implanting a second well of the second-doping-type material into the semiconductor substrate, the drain region separated from the floating diffusion region by a channel region;
   a gate structure deposited on the semiconductor substrate directly above at least the channel region and having a gate electrode patterned thereon; and
   a gate isolating layer formed on the semiconductor substrate to electrically isolate the gate structure from at least the channel region, the gate isolating layer comprising:
   a Fe segment made of a ferroelectric material and sandwiched between the gate structure and a first channel sub-region of the channel region adjacent to the floating diffusion region, the Fe segment configured to be toggled between a high conversion gain mode and a low conversion gain mode; and
   a dielectric segment sandwiched between the gate structure and a second channel sub-region of the channel region that is adjacent to the drain region and is non-overlapping with the first sub-region.

2. The CIS of claim 1, wherein:
   the Fe segment comprises a plurality of dipoles;
   the plurality of dipoles is configured to align in a first orientation responsive to receipt at the gate electrode of a write pulse in a first polarity, and to remain aligned in the first orientation subsequent to the write pulse, the first orientation corresponding to positive ends of the plurality of dipoles pointing toward the first channel sub-region; and the plurality of dipoles is configured to align in a second orientation responsive to receipt at the gate electrode of the write pulse in a second polarity opposite the first polarity, and to remain aligned in the second orientation subsequent to the write pulse, the second orientation corresponding to negative ends of the plurality of dipoles pointing toward the first channel sub-region.

3. The CIS of claim 2, wherein the dielectric segment is configured, responsive to receipt at the gate electrode of a reset pulse at a magnitude below that of the write pulse, to form a current channel between the floating diffusion and drain regions across the channel region.

4. The CIS of claim 3, wherein the reset pulse has a magnitude less than half that of the write pulse.

5. The CIS of claim 1, wherein each of the first channel sub-region and the second channel sub-region extends over approximately half of the channel region.

6. The CIS of claim 1, wherein the photo-sensor block comprises a plurality of photodiodes configured to share the floating diffusion region.

7. The CIS of claim 1, wherein the at least one photodiode is an array of imaging pixels supported by the semiconductor substrate and configured to produce pixel output signals responsive to exposure to incident light, such that the pixel output signals collectively represent image information of an image carried by the incident light.

8. The CIS of claim 1, wherein the at least one photodiode comprises:
a collection region in which to accumulate the photocarriers prior to transfer of the accumulated photocarriers to the floating diffusion region for readout, the collection region separated from the floating diffusion region by a transfer channel region; and
a transfer gate deposited on the semiconductor substrate above the transfer channel region and having a transfer electrode patterned thereon, which, when actuated, forms a transfer current channel to transfer the accumulated photocarriers from the collection region to the floating diffusion region across the transfer channel region.

9. The CIS of claim 1, wherein the imaging pixel further comprises:
a source follower block supported by the substrate and coupled to the floating diffusion region to produce a pixel output signal representative of a quantity of the accumulated photocarriers transferred to the floating diffusion region based on whether the Fe segment is presently toggled to the high conversion gain mode or the low conversion gain mode.

10. The CIS of claim 9, wherein the imaging pixel further comprises:
a select block supported by the substrate and coupled to the source follower block to respond to an applied select control signal in selecting or de-selecting the imaging pixel.

11. A hybrid ferroelectric-metal-oxide-semiconductor field effect transistor (Fe-MOSFET) device comprising:
a semiconductor substrate doped according to a first doping type;
a source region and a drain region, each formed by implanting a respective well of second-doping-type material into the semiconductor substrate, the source region and the drain region separated by a channel region;
a gate structure deposited on the semiconductor substrate directly above at least the channel region and having a gate electrode patterned thereon; and
a gate isolating layer formed on the semiconductor substrate to electrically isolate the gate structure from at least the channel region, the gate isolating layer comprising:
a Fe segment made of a ferroelectric material and sandwiched between the gate structure and a first channel sub-region of the channel region adjacent to the source region; and
a dielectric segment sandwiched between the gate structure and a second channel sub-region of the channel region that is adjacent to the drain region and is non-overlapping with the first sub-region.

12. The hybrid Fe-MOSFET device of claim 11, wherein:
the Fe segment comprises a plurality of dipoles;
the plurality of dipoles is configured to align in a first orientation responsive to receipt at the gate electrode of a write pulse in a first polarity, and to remain aligned in the first orientation subsequent to the write pulse, the first orientation corresponding to positive ends of the plurality of dipoles pointing toward the first channel sub-region; and
the plurality of dipoles is configured to align in a second orientation responsive to receipt at the gate electrode of the write pulse in a second polarity opposite the first polarity, and to remain aligned in the second orientation subsequent to the write pulse, the second orientation corresponding to negative ends of the plurality of dipoles pointing toward the first channel sub-region.

13. The hybrid Fe-MOSFET device of claim 12, wherein the dielectric segment is configured, responsive to receipt at the gate electrode of a reset pulse at a magnitude below that of the write pulse, to form a current channel between the source and drain regions across the channel region.

14. The hybrid Fe-MOSFET device of claim 13, wherein the reset pulse has a magnitude less than half that of the write pulse.

15. The hybrid Fe-MOSFET device of claim 11, wherein each of the first channel sub-region and the second channel sub-region extends over approximately half of the channel region.

16. The hybrid Fe-MOSFET device of claim 11, wherein the ferroelectric material comprises one or more of HfZrO, PbTiO, or BiTiO.

17. The hybrid Fe-MOSFET device of claim 11, wherein the gate structure is formed of a non-metal material that is doped to be electrically conductive.

18. A method for generating a pixel output signal with dual conversion gain in a complementary metal-oxide semiconductor (CMOS) imaging sensor (CIS), the method comprising:
communicating a write pulse at a write magnitude and at one of two write polarizations to a gate electrode of a hybrid ferroelectric-metal-oxide-semiconductor field effect transistor (Fe-MOSFET), the hybrid Fe-MOSFET comprising:
a drain region and a source region, each formed by implanting, into a semiconductor substrate of a first doping type, a well of a second doping type, the drain region separated from the source region by a channel region;

a gate structure deposited on the semiconductor substrate directly above at least the channel region and having the gate electrode patterned thereon; and a gate isolating layer formed on the semiconductor substrate to electrically isolate the gate structure from at least the channel region, the gate isolating layer comprising a Fe segment and a dielectric segment, the Fe segment made of a ferroelectric material and sandwiched between the gate structure and a first channel sub-region of the channel region adjacent to the source region, and the dielectric segment sandwiched between the gate structure and a second channel sub-region of the channel region that is adjacent to the drain region and is non-overlapping with the first sub-region, wherein the write pulse writes the Fe segment to a selected one of two conversion gain modes by aligning dipoles of the ferroelectric material to a corresponding one of two ferroelectric polarization states in accordance with whichever of the write polarizations is communicated by the write pulse; and communicating a reset pulse at a reset magnitude to the gate electrode of the hybrid Fe-MOSFET subsequent to the communicating the write pulse, the reset magnitude being less than the write magnitude, such that the dielectric segment responds to the reset pulse to form a current channel between the source region and the drain region across the channel region without affecting alignments of the dipoles in the Fe segment.

19. The method of claim 18, wherein the source region is a floating diffusion region of a photo-sensor block supported by the semiconductor substrate, and further comprising:

communicating a transfer signal to a transfer gate of the photo-sensor block to transfer accumulated photocarriers to the floating diffusion region subsequent to communicating the write pulse and the reset pulse, the accumulated photocarriers being accumulated in the photo-sensor block responsive to exposing one or more photo-sensors of the photo-sensor block to incident illumination.

20. The method of claim 19, further comprising:

reading out the accumulated photocarriers from the floating diffusion region to generate a pixel output signal that correspond to a quantity of the accumulated photocarriers with a conversion gain based on the selected one of the two conversion gain modes.

* * * * *